United States Patent
Guillouard et al.

(10) Patent No.: US 7,522,535 B2
(45) Date of Patent: Apr. 21, 2009

(54) METHOD OF ADJUSTMENT FOR RECEIVER OF SIGNALS TRANSMITTED IN BURSTS AND CORRESPONDING RECEIVERS

(75) Inventors: Samuel Guillouard, Chantepie (FR); Patrick Lopez, Livré s/ Changeon (FR); Patrick Fontaine, Rennes (FR); Renaud Dore, Rennes (FR); Vincent Demoulin, Pleumeleuc (FR)

(73) Assignee: Thomson Licensing, Boulogne, Billancourt (FR)

( * ) Notice: Subject to any disclaimer, the term of this patent is extended or adjusted under 35 U.S.C. 154(b) by 871 days.

(21) Appl. No.: 10/636,399

(22) Filed: Aug. 7, 2003

(65) Prior Publication Data

US 2004/0037232 A1    Feb. 26, 2004

(30) Foreign Application Priority Data

Aug. 8, 2002   (FR) .................................. 02 10296

(51) Int. Cl.
*G01R 31/08* (2006.01)

(52) U.S. Cl. .................. 370/252; 370/278; 370/282; 370/330; 370/336; 370/344; 370/345; 370/350; 370/478; 370/520

(58) Field of Classification Search ................. 370/890, 370/252, 278, 282, 330, 336, 343–345, 350, 370/478, 498, 503, 520
See application file for complete search history.

(56) References Cited

U.S. PATENT DOCUMENTS

| | | | |
|---|---|---|---|
| 4,004,226 A * | 1/1977 | Qureshi et al. ............... | 375/231 |
| 5,184,349 A | 2/1993 | Riordan ....................... | 370/95.3 |
| 5,749,066 A * | 5/1998 | Nussbaum .................... | 704/232 |
| 5,825,771 A * | 10/1998 | Cohen et al. ................. | 370/394 |
| 6,363,127 B1 | 3/2002 | Heinonen et al. ............ | 375/345 |
| 6,373,433 B1 * | 4/2002 | Espax et al. ................. | 342/368 |
| 2004/0042387 A1 * | 3/2004 | Geile .......................... | 370/206 |

FOREIGN PATENT DOCUMENTS

| | | |
|---|---|---|
| EP | 869647 | 10/1998 |
| JP | 10-126373 | 5/1998 |

OTHER PUBLICATIONS

Patent Abstracts of Japan, vol. 1998 & JP 10-126373.
Search Report dated Apr. 16, 2003.

* cited by examiner

*Primary Examiner*—Seema S Rao
*Assistant Examiner*—Sai-Ming Chan
(74) *Attorney, Agent, or Firm*—Robert D. Shedd; Vincent E. Duffy; Michael A. Pugel

(57) ABSTRACT

Method of adjustment of a receiver of signals transmitted in bursts in a system where the communications are set up within the context of successive frames comprising slots allocatable to the transmitters for their communications with the receivers. The adjustment of at least one characteristic of the receiver allows it to adapt upon the arrival of the bursts, by taking account of at least one reinitialization parameter for a first burst or adjustment parameter computed by a computation unit (4) from the preamble of the burst currently being received. At least one specified adjustment parameter is determined by a computation unit (4), for a new burst of a communication, by taking into account the part of the signal corresponding to the payload of the burst previously received for this communication, if the new is separated from this previously received burst only by a time which is less than a silence threshold value.

6 Claims, 2 Drawing Sheets

METHOD OF ADJUSTMENT FOR RECEIVER OF SIGNALS TRANSMITTED IN BURSTS AND CORRESPONDING RECEIVERS

This application claims the benefit, under 35 U.S.C. § 365 of French Patent Application 02/10296, filed Aug. 8, 2002.

BACKGROUND OF THE INVENTION

1. Field of the Invention

The invention relates to a method of adjusting a receiver of signals, corresponding to digital data packets which are transmitted in bursts, in a communications system. This method is intended to permit dynamical adaptation of the receiver to the characteristics of the various bursts which are successively received, in the case where at least one communication involves a transmission carried out by a succession of bursts.

The invention also relates to receivers that comprise a device allowing the utilization of this method, during the reception of signals as envisaged hereinabove.

2. Related Art

Good reception of signals transmitted by radio conventionally involves tuning the receiver to the transmission frequency Ftx used by the apparatus transmitting the signals and gain adjustment which allows the receiver to pick up under good conditions the signals transmitted from the transmitter apparatus utilizing this frequency Ftx. High accuracy as regards frequency tuning and a wide dynamic power range are usually necessary at the receiver level. This is the case in particular when receivers receive signals, relating to different applications, that are transmitted within the context of radiocommunications systems for which common standards are fixed and where these standards are applied by hardware that is not necessarily identical. Such hardware may exhibit different characteristics, in particular as regards power, and moreover it might not be placed under the same conditions as regards transmission/reception with respect to one another.

Good adjustment of a receiver may be tricky to achieve, in particular in the case where the signals received correspond to digital data packets that are transmitted in bursts from one or possibly more transmitters. In systems where the signals are transmitted in bursts, it must be possible for a receiver to be locked quickly onto the frequency used by a transmitter, when the latter sends it information in bursts. It must also be possible for such a receiver to adjust itself quickly in terms of power so as to be able to correctly pick up any burst intended for it so as to place itself under conditions which allow it to recover the data packets constituting the payload transmitted by the bursts. Such are in particular the requirements for receivers of communication systems implementing digital modulation, of OFDM type, according to which a signal to be transmitted is split over several narrowband channels having different frequencies.

Each receiver must, in particular, be capable of discerning without fail the arrival of a burst and consequently that of the preamble which appears at the head of this burst. It must therefore be capable of tuning itself quickly to the frequency Ftx utilized for the transmission of the burst of packets and/or of tailoring its gain as a function of the power of the signal that it receives.

Conventionally, the radio signal picked up by a receiver is taken into account by a subassembly of analog means designed to permit the extraction of the radio signals that served in the transmission of the data packets destined for it and that are received by the receiver in the environment wherein it is situated.

The above-envisaged subassembly of means commonly comprises an adjustable frequency changer, acting by down-conversion and an automatic gain controller. The changer is driven by a signal of frequency Frx and it is utilized in order to lower the frequency Ftx of the radio signal received. The automatic gain controller comprises an adjustable-gain amplifier which is placed downstream of the changer and whose gain is controlled by way of an adjustment signal G. Such a subassembly is designed to supply a transposed signal whose frequency is in the allowable frequency range by a first stage of the signal processing subassembly, which follows it, and whose power is matched with that allowed at input by this first stage.

Customarily, the means of the first subassembly are preadjustable so as to be effective as soon as a burst liable to contain useful data is received. It must therefore be possible if necessary to reinitialize them for each new burst in the case of a burst-based communication system.

Customarily, a receiver is furnished with two fixed reinitialization parameters that correspond, one to a predetermined value of frequency correction Frst and the other to a predetermined value of gain correction Grst. These parameters are intended respectively to be utilized so as to act, one on the gain adjustment amplifier and the other on the frequency changer.

As soon as the preamble of a new burst is received, it is processed, at the level of the receiver that receives it. The object of the processing of this preamble is to make it possible to quickly determine the signal frequency and power relating to the burst in which it is included and to define the corresponding adjustment parameters. These parameters are utilized to make it possible to act immediately on the changer and/or on the adjustment amplifier, when there is a requirement therefor, so as to allow optimum reception of the packets constituting the payload transmitted by the burst. As soon as the burst has been received in full, the changer and the adjustment amplifier are ordinarily reinitialized.

The frequency and power determinations carried out by taking account of a burst preamble may however prove to be insufficiently precise and lead to insufficiently accurate adjustments. It is possible that an incorrect frequently adjustment and/or gain adjustment may lead to a significant decrease in the reception performance of a receiver. It is also possible that a or a string of bursts transmitted may not be processed by a receiver, if the preamble detection phase is not carried out in a satisfactory manner by this incorrectly adjusted receiver.

SUMMARY OF THE INVENTION

The present invention therefore proposes a method of adjustment of a receiver of signals that correspond to digital data packets transmitted in bursts in a system where the communications are set up within the context of successive frames comprising slots allocatable to the transmitters for their communications with the receivers. This method provides for the adjustment of at least one characteristic of the receiver allowing it to adapt upon the arrival of the bursts, by taking account of at least one reinitialization parameter determined for a first burst or of at least one adjustment parameter computed from the preamble of the burst, in the case of a burst currently being received.

According to a characteristic of the method according to the invention, it provides for complementary adjustment of the receiver, in the case where at least one communication involves a transmission carried out by a succession of bursts from a transmitter, this complementary adjustment being performed by means of at least one adjustment parameter determined by computation, for a new burst of a communication, by taking into account the part of the signal corresponding to the payload of the burst previously received for this communication, if the said new burst is separated from this previously received burst only by a time which is less than a specified silence threshold value.

According to the invention, an adjustment parameter determined by computation for a new burst of a communication, by taking into account the part of the signal corresponding to the load of the burst previously received for this same communication, is a frequency adjustment parameter, corresponding to the frequency drift, determined at the level of the receiver for the signal received on the basis of the said part taken into account.

According to the invention, an adjustment parameter determined by computation for a new burst of a communication, by taking into account the part of the signal corresponding to the load of the burst previously received for this same communication, is a parameter for adjusting gain on reception.

According to a characteristic of a variant of the invention, there are provided different specified silence threshold values that are selectively associated with the various parameter types computed on the basis of the parts corresponding to the payloads of the bursts and/or to the applications served.

The invention also proposes receivers that are equipped with devices making it possible to utilize the method, as defined hereinabove.

One of these receivers comprises adjustable means of low-frequency transposition of the radio signals received, adjustable means of gain control at input making it possible to modify the power of the signal received as a function of the requirements of an input stage of a subassembly of data processing means making it possible to restore in utilizable form the data transmitted, means for supplying frequency correction and/or gain correction parameters, some on the basis of at least one memory unit for receiver reinitialization purposes, others by way of a burst preamble-based computation module, the selection of one or more stored or computed parameters being effected under the supervision of management means associating a time base with state machines by way of switches for selective transmission of the parameters to auxiliary means making it possible to act on the frequency-transposition and gain adjustment means.

According to a characteristic of the invention, this receiver also comprises means for supplying frequency correction and/or gain correction parameters, by way of a burst payload-based computation module, to the auxiliary means making it possible to act on the frequency transportation and/or gain adjustment means, via the switches under the supervision of the management means.

According to a characteristic of a variant receiver according to the invention, the latter comprises a burst payload-based computation module linked to a number of switches which is equal to the number of transmitters with which the receiver has to be simultaneously in communication, via memory means making it possible to store the correction parameters computed with each burst for each communication, an additional switch allowing selective linking of the other switches and at least one reinitialization parameter memory unit with the auxiliary means making it possible to act on the frequency transposition and/or gain adjustment means, under the supervision of the management means.

BRIEF DESCRIPTION OF THE DRAWINGS

The invention, its characteristics and its advantages are specified in the description which follows in conjunction with the figures mentioned hereinbelow.

DETAILED DESCRIPTION OF THE PREFERRED EMBODIMENT

The method of adjustment, according to the invention, is more particularly intended to be implemented within the context of a receiver envisaged for receiving radio signals which correspond to data packets which are transmitted in bursts. As already indicated above, the signals are liable to be signals subjected to an OFDM type modulation.

Figure 1:
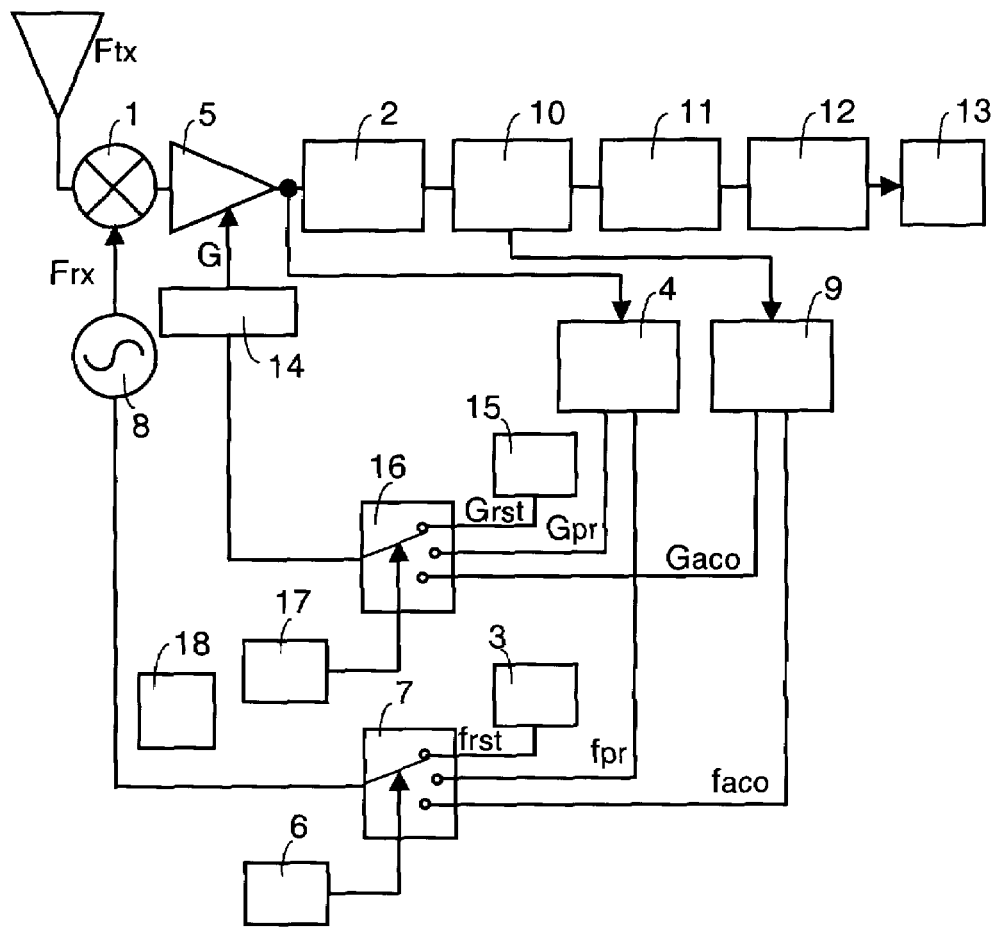
FIG. 1 depicts a block diagram of a receiver devised to allow the implementation of the method according to the invention.

An exemplary receiver allowing the utilization of the method according to the invention is illustrated in FIG. 1. It comprises a subassembly of analogue means which is envisaged for picking up the radio signals and for conditioning them in such a way as to allow them to be taken into account by a signal processing subassembly which is responsible in particular for extracting the useful data that these radio signals have made it possible to transmit.

The subassembly of analog means conventionally comprises an antenna linked to a frequency changer 1 by way of which the frequency Ftx of a signal received is transposed to a reduced level allowing it to be taken into account by a first stage 2 of the signal processing subassembly. This first stage 2 is commonly an IFFT (inverse fast Fourier transform) computation module, in particular in the case of an OFDM receiver.

The changer 1 is adjustable in such a way that the receiver that includes it can be locked precisely onto the frequency Ftx of the signal then received with a view to optimal reception. In a known manner, this adjustment may be carried out by taking account of an adjustment parameter that is predetermined or alternatively computed from the burst preamble for each new burst. The predetermined adjustment parameter is ordinarily a reinitialization parameter Frst which is of fixed value and which is more particularly used after a phase of silence, in the absence of any burst. It is assumed to be stored in a memory unit referenced 3 in FIG. 1.

Provision is made to be able to determine a new frequency adjustment parameter fpr from the preamble of each new burst on receipt of this preamble. This parameter fpr is here assumed to be determined in a manner known to the person skilled in the art, by a preamble-based computation module 4 of the processing subassembly. The latter receives the signal originating from the changer 1, via an amplifier 5 designed to allow adjustment of the power level of the signal transmitted so that this signal can be utilized by the modules of the processing subassembly, i.e. here the modules 2 and 4.

The choice between parameters frst and fpr is made by a state machine 6 which controls a switch 7 allowing selective linking of either the unit 3 which stores the parameter frst, or the preamble-based computation module 4, with a generator 8. The latter is devised, in a known manner to be able to generate a frequency control signal Frx for the changer 1, as a function of the frequency adjustment parameter that it receives.

According to the invention, the state machine 6 and the switch 7 are modified to make it possible to take into account an additional frequency adjustment parameter Faco computed by a payload-based computation module 9.

This module 9 is here designed to take into account the part of a burst that corresponds to its payload and to determine, accurately and in a manner known to the person skilled in the art, the received signal's frequency which was utilized for this burst. The time required for the transmission of the payload contained in a burst is normally markedly longer than that required for the transmission of the preamble and therefore makes it possible to obtain better performance as regards frequency determination and computation.

In the exemplary embodiment of a receiver depicted in FIG. 1, the values taken into account by the payload-based computation module 9 are supplied to it by an equalizer 10 placed downstream of the IFFT computation module constituting the first stage 2 of the signal processing subassembly. In a known manner which is illustrated in FIG. 1, this equalizer 10 is situated upstream of a demodulator 11 and of a decoder 12 that are arranged in series.

The equalizer 10 is more particularly intended to eliminate the distortions of the signal received that are due to the channel utilized for the radio transmission. The demodulator 11 is utilized to search the coded sequences appearing in the signal originating from the equalizer, whereas the decoder 12 makes it possible to restore at the level of an output stage 13 of the receiver the data to their initial form by utilizing the sequences supplied to it by the demodulator.

The equalizer 10 moreover makes it possible to determine the ideal frequency Frx to be used to perform the downconversion required as a function of the frequency Ftx used for a burst of the radio signal received by observation of the rotation of the equalization coefficients during this burst.

According to the invention, the module 9 is utilized to formulate a frequency adjustment parameter Faco taking into account the frequency which has been determined from the part corresponding to the payload of a burst. The switch 7 can be controlled by the state machine 6 so as to selectively link the memory unit 3, or either of the computation modules 4 and 9, to the generator 8. The state machine 6 permits the switching of the inputs of the switch 7 onto its output and consequently their selective linking with the generator 8, as a function of a time counting. The latter is carried out in a manner known per se by way of management logic 18 including a time base.

The manner of operation of the state machine 6 is organized temporally in such a way that the frequency adjustment parameter Faco, determined from the part corresponding to the payload of a burst received from a transmitter within the context of a communication, can be utilized for the next burst of this communication, from the moment that the time separating these two bursts remains less than a specified silence threshold value.

From the moment that a time greater than the silence threshold value has elapsed from the receipt of a burst for a given communication, there is provision according to the invention for the state machine 6 of the receiver envisaged hereinabove to revert to its customary manner of operation in which the frequency adjustment parameter chosen is initially the reinitialization parameter frst.

The method of adjustment, according to the invention, moreover makes provision for a possibility of determining an additional gain adjustment parameter Gaco determined by the payload computation module 9 through a computation performed on the basis of the part of a burst corresponding to this payload, in addition to the customarily envisaged parameters for reinitialization of gain adjustment Grst and for gain adjustment as a function of the burst preamble Gpr.

In the case of the receiver, as described in conjunction with FIG. 1, provision is therefore made to cause these three parameters to act selectively, via an interface stage 14, on a gain adjustment input which the input amplifier 5 of the receiver conventionally comprises. The value of the gain parameter Gaco is obtained by computation of the ideal gain determined from the mean value of the amplitude of the equalization coefficient as observed at the level of the equalizer 10. The values of the gain adjustment parameter Grst on reinitialization and gain parameter Gpr established as a function of the burst preamble are supplied respectively in a manner known per se, the one from a memory unit here referenced 15 and the other from the preamble-based computation module 4.

A switch 16 similar to the switch 7 is controlled by a state machine 17 in such a way as to be able to selectively link up, either the memory unit 15, or one or other of the computation modules 4 and 9, with the input of the interface stage 14 by way of which the gain of the amplifier 5 is supervised. The state machine 17 is organized to be able to operate temporally under conditions which correspond overall to those defined above for the state machine 6. The frequency adjustment parameter Gaco determined from the part corresponding to the payload of a burst received is utilized for the next burst which relates to the same communication, from the moment that a time less than a specified threshold value separates the two bursts. This threshold value can correspond to that envisaged for the operation of the state machine 6, when the two machines 6 and 17 are simultaneously used and when a gain adjustment and a frequency adjustment are carried out in parallel. It can alternatively be chosen to be different, insofar as power variations due to external disturbances may affect the signal received, without affecting the frequency thereof. It is of course conceivable to equip a receiver for just one of these two adjustments, if one of them proves to be superfluous, in view of the conditions of utilization encountered.

Figure 2:
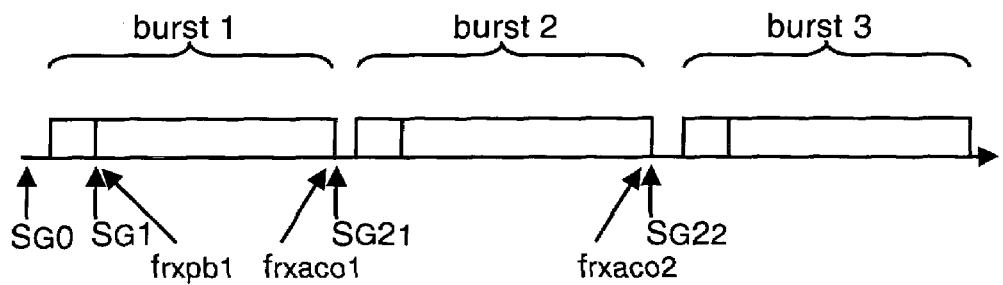
FIG. 2 depicts a chart showing respectively the scheduled switching times and the scheduled adjustments, when the method that forms the subject of the present invention is implemented in a receiver, as defined in relation to FIG. 1.

At the start of a communication for a given receiver, as defined hereinabove in conjunction with FIG. 1, the values of gain correction parameter Grst and of frequency correction parameter frst envisaged for reinitialization purposes are utilized and lead in particular to a gain correction which is referenced SG0 in the chart versus time which is depicted in FIG. 2. This correction is applied to the signal received prior to the receipt of a first burst or burst 1 as illustrated in the figure. As soon as it has been possible for this first burst to be taken into account by the preamble-based computation block 4, the latter delivers a new gain adjustment value Gpr and a new frequency adjustment value fpr which are respectively utilized to steer the choice of a gain referenced SG1 and of an adjustment frequency referenced frapb1 in the chart of FIG. 2. As soon as the part corresponding to the payload of the burst 1 has been able to be recovered by the computation unit 9, the latter delivers a gain adjustment value Gaco and a frequency adjustment value faco. These two values are respectively utilized to steer the choice of a gain referenced SG21 and of an adjustment frequency referenced frxaco1 in FIG. 2, as soon as the burst 1 ends, for the next corresponding burst. This gain and this frequency may possibly remain identical to the gain and to the frequency which were obtained previously for the same communication. The next burst of the same communication is here referenced 2, it is received by the receiver which implements the adjustment frequency frxaco1 and which exhibits a gain SG21, if this burst is separated from burst 1 only by a time span whose duration is less than the fixed threshold value, as mentioned above. Otherwise, the receiver repeats the operations, successively utilizing the gain correction parameter Grst and frequency correction parameter frst on reinitialization, and the gain Gaco and frequency adjustment faco values which may be obtained from the preamble of burst 2. New values of adjustment frxaco2 and of gain SG22, are again obtained at the end of burst 2. They may of course correspond to the values of adjustment frxaco1 and of gain SG21. They are utilized if the reception time lag for the next burst 3 is less than the threshold value. If such is the case, as illustrated in FIG. 2, the burst 3 is received by the receiver which exhibits a gain SG22 and which implements an adjustment frequency frxaco2, both being defined on the basis of the payload transported by the burst 2.

Figure 3:
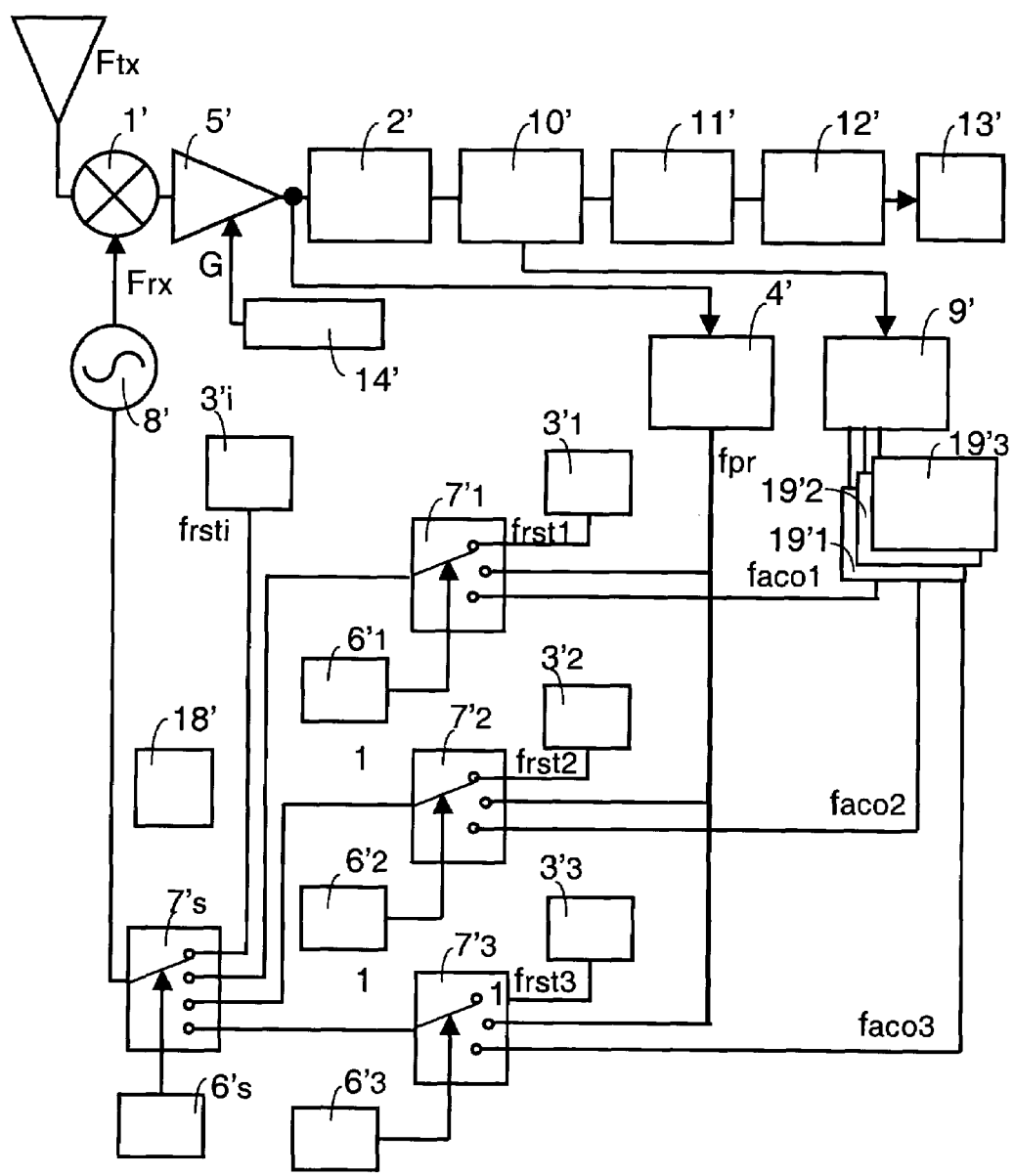
FIG. 3 depicts a diagram of a receiver wherein are more particularly illustrated means relating to the frequency adjustment which allow the implementation of the method according to the invention, when the receiver is devised to be able to receive quasi simultaneously bursts originating from several transmitters within the context of commonly utilized time frames.

FIG. 3 depicts a variant receiver devised to allow the utilization of the method according to the invention, when the receiver is envisaged for being able to receive successive bursts corresponding to data streams relating to communications established simultaneously therewith or by way thereof, in the course of one and the same succession of frames, and for example for applications corresponding to different transmitters.

This receiver comprises a subassembly of analogue means and a signal processing subassembly which are constituted functionally in the same manner as those of the receiver depicted in FIG. 1, their modules being numerically referenced in a corresponding manner, as the frequency changer 1' of FIG. 3 and the frequency changer of FIG. 1. Therefore the functions of the IFFT computation module constituting the first stage 2' of the signal processing subassembly in FIG. 3 are assumed to correspond overall to those of the module constituting the first stage of the signal processing subassembly in FIG. 1. The same is assumed to hold for the preamble-based computation module 4' and payload module 9', for the input amplifier 5', for the generator 8', for the equalizer 10', for the demodulator 11', for the decoder 12', for the output stage 13' and for the management logic 18' of FIG. 3 in relation to modules 4, 9, 5, 8, 10, 11, 12, 13 and 18 of FIG. 1.

The device making it possible to intervene at the gain level is not developed here, insofar as it is deduced simply from the device making it possible to intervene on the frequency, developed hereinbelow, and from the device relating to the gain, developed above in conjunction with FIG. 1.

In the exemplary embodiment depicted in FIG. 3, the receiver is considered to be envisaged to allow the quasi-simultaneous reception of three different transmissions distributed in different slots in the course of the successive frames by way of which they are established. These transmissions may be performed with different frequencies Ftx and at relatively different powers, in particular if it is assumed that they originate from different transmitters.

Two cases are envisaged here, one in which the receiver knows the order of transmission of the transmitters and is therefore capable of defining, at a given instant, which will be the next active transmitter from which it ought to receive a burst, the other in which the receiver is not aware of which will be the next active transmitter. The first case relates in particular to the downlink, uplink and direct link communication systems of Hyperlan 2 networks. The second case relates for example to links organized according to the 802.11a standard.

In both cases, provision is made for an initial predetermined frequency correction parameter frsti for the receiver which is stored in a memory unit 3'$i$ for the purposes of reinitialization in the absence of communication. Provision is also made for a different parameter for each of the three particular communications that may be established simultaneously, each of these predetermined parameters frst1, frst2, frst3 being assumed here to be stored in a different memory unit 3'1, 3'2, 3'3. It is moreover envisaged that the preamble-based computation unit can supply an adjustment parameter fpr on receipt of each burst preamble, as before. This parameter is transmitted to an input of a switch 7'1, 7'2 or 7'3 assigned to the communication of which the burst received forms part.

According to the invention, the payload-based computation unit 9' is able to supply a frequency adjustment parameter faco from each useful part of a communication burst that is received. If a burst is followed by a burst of the same communication within a time lag of less than a specified silence threshold value, there is provision to utilize the parameter faco obtained for the first burst to adjust the frequency Frx of the receiver for the reception of the second. The silence threshold value may possibly not be chosen to be identical for all communications. The adjustment parameters faco1, faco2, faco3 respectively obtained are temporarily kept in elements 19'1, 19'2, 19'3 of a memory fed by the payload-based computation unit 9'. Each element 19'1, 19'2 or 19'3 temporarily stores the storage parameter computed for the last burst received of the communication, to which it is assigned, so as to allow its transmission to the control input of the generator 8', via the switch 7'1, 7'2 or 7'3 to an input of which it is selectively linked.

As before, a state machine 6'1, 6'2 or 6'3 is associated with each switch 7'1, 7'2, 7'3. An additional switch 7's, to which an additional state machine 6's is assigned, is used to make it possible to selectively link the output of the memory unit 3'$i$ or the output of one or other of the switches 7'1, 7'2, 7'3, to the control input of the generator 8', under the supervision of the management logic 18' acting by way of the various state machines. The operations are then performed in a similar manner to that described above in relation to the receiver illustrated in FIG. 1. The parameters relating to a communication, such as for example frst1, Fpr1 and faco1 are selectively used under the conditions similar to those defined above in the case of a specified communication, here considered to be established first with a first transmitter. The same holds for example for the parameters frst2, Fpr2 and faco2 in conjunction with a second communication established via a second transmitter, the parameter frsti being utilized in case of complete reinitialization.

The invention claimed is:

1. Method of adjustment of a receiver of signals that correspond to digital data packets transmitted in bursts in a system where the communications are set up within the context of successive frames comprising slots allocatable to the transmitters for their communications with the receivers, the method implemented in the receiver comprising the step of:

providing for the adjustment of at least one characteristic of the receiver allowing it to adapt upon the arrival of the bursts, by taking account of at least one reinitialization parameter determined by the receiver for a first burst or of at least one adjustment parameter computed by the receiver from the preamble of the burst, in the case of a burst currently being received, and providing for complementary adjustment of the receiver, in the case where at least one communication involves a transmission carried out by a succession of bursts from a transmitter, this complementary adjustment being performed in the receiver by means of at least one adjustment parameter determined by computation, for a new burst of a communication, by taking into account the part of the signal corresponding to the payload of the burst previously received for this communication, if the said new burst is separated from this previously received burst only by a time which is less than a specified silence threshold value.

2. Method of adjustment, according to claim 1, wherein an adjustment parameter determined by computation for a new burst of a communication, by taking into account the part of the signal corresponding to the load of the burst previously received for this same communication, is a frequency adjustment parameter, corresponding to the frequency drift, determined at the level of the receiver for the signal received on the basis of the said part taken into account.

3. Method of adjustment, according to claim 1, wherein the adjustment parameter determined by computation for a new burst of a communication, by taking into account the part of the signal corresponding to the load of the burst previously received for this same communication, is a parameter for adjusting gain on reception.

4. Method of adjustment, according to claim 1, wherein are provided different specified silence threshold values that are selectively associated with the various parameter types computed on the basis of the parts corresponding to the payloads of the bursts.

5. Receiver of signals, that correspond to digital data packets transmitted in bursts in a system where the communications are set up within the context of successive frames comprising slots allocatable to the transmitters for their communications with the receivers, the receiver comprising:

adjustable means of low-frequency transposition of the radio signals received, adjustable means of gain control at input making it possible to modify the power of the signal received as a function of the requirements of an input stage of a subassembly of data processing means making it possible to restore in utilizable form the data transmitted, an adjustment of frequency and/or gain being determined by the receiver for a first burst or of at least one adjustment parameter computed from the preamble of the burst, in the case of a burst currently being received, means for supplying frequency correction and/or gain correction parameters, some on the basis of at least one memory unit for receiver reinitialization purposes, others by way of a burst preamble-based computation module, the selection of one or more stored or computed parameters being effected under the supervision of management means associating a time base with state machines by way of switches for selective transmission of the parameters to auxiliary means making it possible to act on the frequency-transposition and gain adjustment means, means for supplying frequency correction and/or gain correction parameters, by way of a burst payload-based computation module, to the auxiliary means, via the switches under the supervision of the management means, the correction parameters being determined, for a new burst of a communication, by taking into account the part of the signal corresponding to the payload of the burst previously received for this communication, if the said new burst is separated from this previously received burst only by a time which is less than a specified silence threshold value.

6. Receiver, according to claim 5, in which the burst payload-based computation module is linked to a number of switches which is equal to the number of transmitters with which the receiver has to be simultaneously in communication, via memory means making it possible to store the correction parameters computed with each burst for each communication, an additional switch allowing selective linking of the other switches and at least one reinitialization parameter memory unit with the auxiliary means making it possible to act on the frequency transposition and/or gain adjustment means, under the supervision of the management means.

* * * * *